US010069472B2

(12) United States Patent
Lee et al.

(10) Patent No.: US 10,069,472 B2
(45) Date of Patent: Sep. 4, 2018

(54) BULK ACOUSTIC WAVE RESONATOR AND FILTER INCLUDING THE SAME

(71) Applicant: SAMSUNG ELECTRO-MECHANICS CO., LTD., Suwon-si (KR)

(72) Inventors: Moon Chul Lee, Suwon-si (KR); Yeong Gyu Lee, Suwon-si (KR); Chul Soo Kim, Suwon-si (KR); Jea Shik Shin, Suwon-si (KR); Duck Hwan Kim, Suwon-si (KR); Sang Uk Son, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 94 days.

(21) Appl. No.: 15/007,725

(22) Filed: Jan. 27, 2016

(65) Prior Publication Data

US 2016/0301380 A1 Oct. 13, 2016

(30) Foreign Application Priority Data

Apr. 10, 2015 (KR) .................. 10-2015-0051129
Jun. 25, 2015 (KR) .................. 10-2015-0090654

(51) Int. Cl.
*H03H 9/02* (2006.01)
*H03H 9/17* (2006.01)
(Continued)

(52) U.S. Cl.
CPC ........ *H03H 9/02133* (2013.01); *H03H 9/173* (2013.01); *H03H 9/587* (2013.01); *H03H 9/605* (2013.01)

(58) Field of Classification Search
CPC .... H03H 9/02133; H03H 9/173; H03H 9/587; H03H 9/605; H03H 9/174; H03H 9/588
(Continued)

(56) References Cited

U.S. PATENT DOCUMENTS 6,329,305 B1 12/2001 Bower et al.
7,212,082 B2 * 5/2007 Nagao .................. H01L 41/316 310/324
(Continued)

FOREIGN PATENT DOCUMENTS

CN 1326266 A 12/2001
CN 1894849 A 1/2007
(Continued)

OTHER PUBLICATIONS

Machine English Translation of JP 2005-045694 Published on Feb. 17, 2005.*
(Continued)

*Primary Examiner* — Robert J Pascal
*Assistant Examiner* — Jorge Salazar, Jr.
(74) *Attorney, Agent, or Firm* — NSIP Law

(57) ABSTRACT

A bulk acoustic wave resonator including a substrate; an air cavity formed on the substrate; and a resonating part formed on the air cavity and comprising a first electrode, a piezoelectric layer, and a second electrode which are sequentially laminated, wherein a cross section of the air cavity has a short side, a long side opposing the short side, a first lateral side and a second lateral side connecting the short side and the long side to each other, the first and second lateral sides are inclined, and a surface roughness of the first electrode, the piezoelectric layer, the second electrode, or any combination thereof is between 1 nm and 100 nm.

18 Claims, 5 Drawing Sheets

(51) Int. Cl.
*H03H 9/58* (2006.01)
*H03H 9/60* (2006.01)

(58) Field of Classification Search
USPC ............... 333/187, 188, 189; 310/324, 349
See application file for complete search history.

(56) References Cited

U.S. PATENT DOCUMENTS

| | | | |
|---|---|---|---|
| 2002/0089261 A1 | 7/2002 | Beaver | |
| 2005/0006984 A1* | 1/2005 | Komuro | H03H 3/02 310/324 |
| 2005/0077803 A1* | 4/2005 | Ha | H03H 3/02 310/324 |
| 2006/0033595 A1 | 2/2006 | Nagao et al. | |
| 2008/0081398 A1 | 4/2008 | Lee et al. | |
| 2011/0298564 A1* | 12/2011 | Iwashita | H03H 3/02 333/187 |

FOREIGN PATENT DOCUMENTS

| | | |
|---|---|---|
| JP | 2005-0006984 A1 * | 2/2005 |
| JP | 2005-045694 A | 2/2005 |
| JP | 2006-254295 A | 9/2006 |
| JP | 2008-113401 A | 5/2008 |
| JP | 2010-041153 A | 2/2010 |
| KR | 10-0859674 B1 | 9/2008 |

OTHER PUBLICATIONS

Korean Office Action dated Dec. 27, 2016, in counterpart Korean Application No. 10-2015-0090654 (6 pages in English, 6 pages in Korean).

Chinese Office Action dated Mar. 23, 2016 in Chinese Patent Application No. 20160040724.8 (12 pages in English, 9 pages in Chinese).

* cited by examiner

BULK ACOUSTIC WAVE RESONATOR AND FILTER INCLUDING THE SAME

CROSS-REFERENCE TO RELATED APPLICATIONS

This application claims the benefits under 35 USC 119(a) of Korean Patent Application Nos. 10-2015-0051129 and 10-2015-0090654 filed on Apr. 10, 2015 and Jun. 25, 2015, respectively, with the Korean Intellectual Property Office, the entire disclosures of which are incorporated herein by reference for all purposes.

BACKGROUND

1. Field

The following description relates to a bulk acoustic wave resonator and a filter including the same.

2. Description of Related Art

In accordance with a rapid increase in development of mobile communications devices, chemical devices, and biological devices the demand for compact and lightweight filters, oscillators, resonant elements, acoustic resonant mass sensors, and other elements has also increased.

As a means for implementing the compact and lightweight filters, oscillators, resonant elements, and acoustic resonant mass sensors, a film bulk acoustic resonator (hereinafter referred to as "FBAR") is well known in the art. The FBAR has an advantage in that it may be mass produced at a minimal cost and may be subminiaturized. Further, the FBAR has advantages in that it allows a high quality factor Q value, which is a main property of a filter. Further, the FBAR may even be used in a micro-frequency band, and operate at bands of a personal communications system (PCS) and a digital cordless system (DCS). Generally, the FBAR has a structure including a resonating part formed by sequentially laminating a first electrode, a piezoelectric layer, and a second electrode on a substrate.

An operation principle of the FBAR will be described below. First, when an electric field is induced in the piezoelectric layer by applying electric energy to the first and second electrodes, the electric field causes a piezoelectric phenomenon of the piezoelectric layer, thereby causing the resonating part to vibrate in a predetermined direction. As a result, a bulk acoustic wave is generated in the same direction as the vibration direction of the resonating part, thereby causing resonance.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a bulk acoustic wave resonator capable of preventing cracks from being formed in a film or a layer laminated on a substrate and inducing normal crystal growth, and a filter including the same. The bulk acoustic wave resonator includes a substrate; an air cavity formed on the substrate; and a resonating part formed on the air cavity and comprising a first electrode, a piezoelectric layer, and a second electrode which are sequentially laminated, wherein a cross section of the air cavity has a short side, a long side opposing the short side, a first lateral side and a second lateral side connecting the short side and the long side to each other, the first and second lateral sides are inclined, and a surface roughness of the first electrode, the piezoelectric layer, the second electrode, or any combination thereof is between 1 nm and 100 nm.

In another general aspect, a filter includes a plurality of bulk acoustic wave resonators, wherein each of the plurality of bulk acoustic wave resonators includes a substrate; a membrane formed on the substrate to form an air cavity; and a resonating part, formed on the membrane, including a first electrode, a piezoelectric layer, and a second electrode which are sequentially laminated, and a cross section of the air cavity comprises a short side, a long side opposing the short side, and two lateral sides connecting the short side and the long side to each other, the two lateral sides are inclined, and a surface roughness of at least one of the first electrode, the piezoelectric layer, and the second electrode is between 1 nm and 100 nm.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
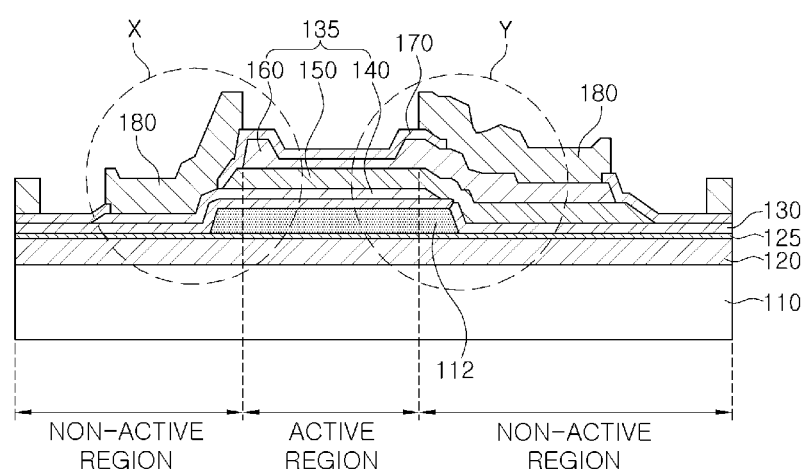
FIG. 1 is a cross-sectional view illustrating an example of a bulk acoustic wave resonator.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Unless indicated otherwise, a statement that a first layer is "on" a second layer or a substrate is to be interpreted as covering both a case where the first layer directly contacts the second layer or the substrate, and a case where one or more other layers are disposed between the first layer and the second layer or the substrate.

Words describing relative spatial relationships, such as "below", "beneath", "under", "lower", "bottom", "above", "over", "upper", "top", "left", and "right", may be used to conveniently describe spatial relationships of one device or elements with other devices or elements. Such words are to be interpreted as encompassing a device oriented as illustrated in the drawings, and in other orientations in use or operation. For example, an example in which a device includes a second layer disposed above a first layer based on the orientation of the device illustrated in the drawings also encompasses the device when the device is flipped upside down in use or operation.

Referring to FIG. 1, a bulk acoustic wave resonator 100 is a film bulk acoustic resonator (hereinafter referred to as "FBAR"), and includes a substrate 110, an insulating layer 120, an air cavity 112, and a resonating part 135.

The substrate 110 may be formed of a typical silicon substrate, and the insulating layer 120 that electrically insulates the resonating part 135 from the substrate 110 is formed on an upper surface of the substrate 110. The insulating layer 120 is formed by depositing silicon dioxide ($SiO_2$) or aluminum oxide ($Al_2O_3$) on the substrate 110 by a chemical vapor deposition, an RF magnetron sputtering method, or an evaporation method.

The air cavity 112 is disposed over the insulating layer 120. The air cavity 112 may have approximately a trapezoidal shape. The air cavity 112 comprises an upper side, a lower side, a first lateral side and a second lateral side. The lower side is opposite and parallel to the upper side, and the first and second lateral sides connect to the upper and lower sides at predetermined angles. Here, a length of the lower side is longer than that of the upper side, and the trapezoidal shape may be symmetrical to each other in relation to the middle point of the upper side and the lower side.

An etching stop layer 125 is further provided between the insulating layer 120 and the air cavity 112. The etching stop layer 125 protects the substrate 110 and the insulating layer 120 from an etching process, and serves as a base necessary to deposit other various layers on the etching stop layer 125.

The air cavity 112 is disposed in a forward direction (a direction in which a long side among the two sides parallel to each other is disposed as the lower side). The air cavity 112 is disposed below the resonating part 135 so that the resonating part 135 vibrates in a predetermined direction. The air cavity 112 may be formed by processes of forming an air cavity sacrifice layer pattern on the insulating layer 120, then forming a membrane 130 on the air cavity sacrifice layer pattern, and etching and removing the air cavity sacrifice layer pattern. The membrane 130 may serve as an oxidation protection layer or serve as a protection layer protecting the substrate 110, or both.

Figure 2:
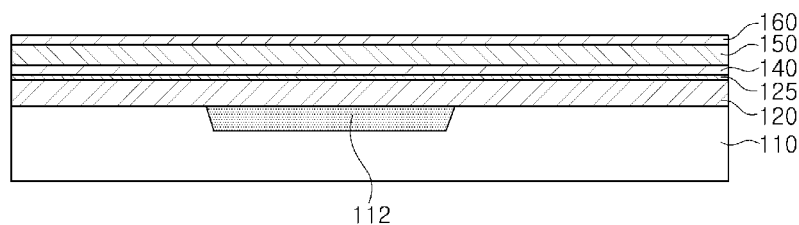
FIG. 2 is a cross-sectional view illustrating another example of a bulk acoustic wave resonator.

In addition, referring to FIG. 2, the air cavity 112 may be disposed in a reverse direction (a direction in which the long side among the two sides parallel to each other is disposed as the upper side). The air cavity 112 is embedded in the substrate 110 by etching a portion of the substrate 110. Since a bulk acoustic wave resonator of FIG. 2 is similar to the bulk acoustic wave resonator of FIG. 1, a detailed description thereof will be omitted.

The resonating part 135 includes a first electrode 140, a piezoelectric layer 150, and a second electrode 160 which are sequentially laminated to be disposed over the air cavity 112. The first electrode 140 is formed on an upper surface of the membrane 130 to cover a portion of the membrane 130. The first electrode 140 is formed of a typical conductive material such as a metal. Specifically, the first electrode 140 may be formed of gold (Au), titanium (Ti), tantalum (Ta), molybdenum (Mo), ruthenium (Ru), platinum (Pt), tungsten (W), aluminum (Al), nickel (Ni), or any combination thereof.

The piezoelectric layer 150 is formed on an upper surface of the membrane 130 and the first electrode 140 to cover a portion of the membrane 130 and a portion of the first electrode 140. The piezoelectric layer 150 generates a piezoelectric effect by converting electric energy into mechanical energy of an acoustic wave type. The piezoelectric layer 150 may be formed of aluminum nitride (AlN), zinc oxide (ZnO), lead zirconium titanium oxide (PZT; $PbZrTiO$), or any combination thereof.

The second electrode 160 is formed on the piezoelectric layer 150. Similarly to the first electrode 140, the second electrode 160 may be formed of a conductive material such as gold (Au), titanium (Ti), tantalum (Ta), molybdenum (Mo), ruthenium (Ru), platinum (Pt), tungsten (W), aluminum (Al), nickel (Ni), or any combination thereof.

The resonating part 135 comprises an active region and a non-active regions. The active region of the resonating part 135 vibrates in a predetermined direction by a piezoelectric effect when electrical energy, such as radio frequency (RF) signals, is applied to the first and second electrodes 140 and 160. The electrical energy induces an electric field in the piezoelectric layer 150. The active region of the resonating part 135 correspond to a region in which the first electrode 140, the piezoelectric layer 150, and the second electrode 160 overlap each other in a vertical direction over the air cavity 112. The non-active regions of the resonating part 135 are regions which are not resonated by the piezoelectric effect even though the electric energy is applied to the first and second electrodes 140 and 160. The non-active regions correspond to regions in which the first electrode 140, the piezoelectric layer 150, and the second electrode 160 do not overlap.

The resonating part 135 having the configuration as described above filters an RF signal of a specific frequency using the piezoelectric effect of the piezoelectric layer 150 as described above. The resonating part 135 resonates the piezoelectric layer 150 according to the RF signals applied to the first electrode 140 and the second electrode 160 to generate an acoustic wave having a specific resonance frequency and an anti-resonance frequency. The resonance of the piezoelectric layer 150 occurs when a half of a wavelength of the applied RF signal corresponds to a thickness of the piezoelectric layer 150. Since electrical impedance is sharply varied when resonance occurs, the bulk acoustic wave resonator may be used as a filter capable of selecting a frequency. Specifically, since the resonating part 135 has a constant resonance frequency according to the vibration occurring in the piezoelectric layer 150, the resonating part 135 outputs only a signal matched to the resonance frequency of the resonating part 135 among the applied RF signals.

A protection layer 170 is disposed on the second electrode 160 of the resonating part 135 to prevent the second electrode 160 from being externally exposed and oxidized, and an electrode pad 180 for applying an electrical signal is disposed on the first electrode 140 and the second electrode 160, which are externally exposed.

Figure 3A:
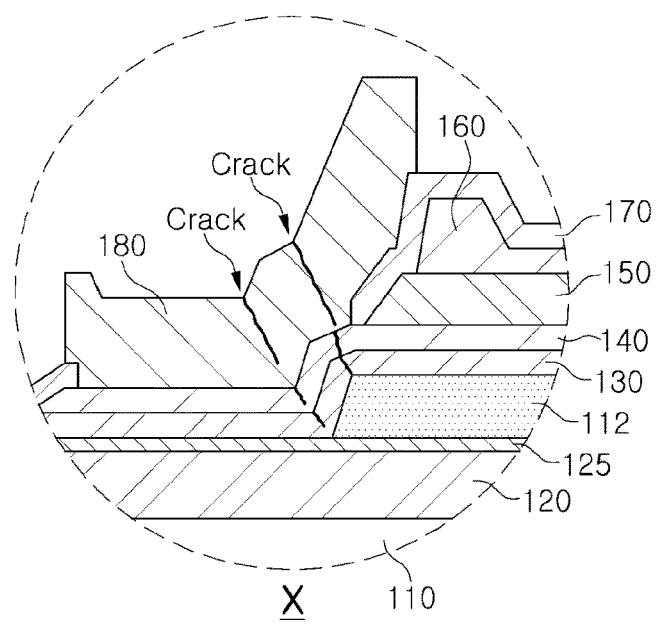
FIGS. 3A and 3B are partially enlarged views of the bulk acoustic wave resonator of FIG. 1.
Figure 3B:
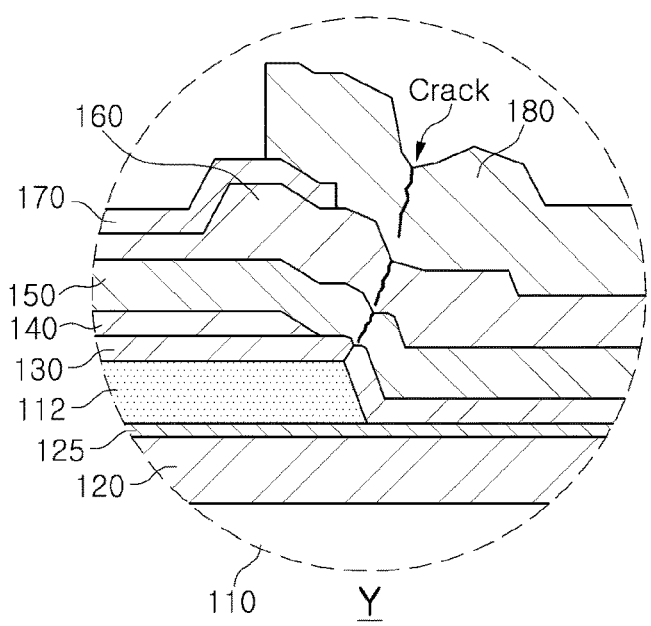

FIG. 3A is an enlarged view of a region X of FIG. 1, and FIG. 3B is an enlarged view of a region Y of FIG. 1.

Referring to FIGS. 3A and 3B, cracks in the electrode pad 180, the first electrode 140 and second electrode 160, piezoelectric layer 150, and membrane 130 may be formed near the first and second lateral sides of the air cavity due the angle of the first and second lateral sides the air cavity 112.

In addition, a crystal of the piezoelectric layer 150 which is laminated in the proximity of the lateral sides of the air cavity 112 may be abnormally grown, thereby causing a problem of insertion loss characteristics and deterioration of attenuation characteristics of the bulk acoustic wave resonator.

Insertion loss characteristics and attenuation characteristics of the bulk acoustic wave resonator are improved by changing the shapes of the legs of a cross section of the air cavity 112, and by changing the angle formed by the legs and at least one of the upper side and the lower side. In addition, cracking of the membrane 130 formed on the air cavity sacrifice layer pattern is prevented by setting a surface roughness (Ra) value of the air cavity sacrifice layer pattern for forming the air cavity 112 between 1 nm and 100 nm. Further, cracking of the electrodes or the layer which are sequentially laminated in the proximity of an inclined portion is prevented by setting surface roughness (Ra) values of the membrane 130, the first electrode 140, the piezoelectric layer 150, and the second electrode 160 between 1 nm and 100 nm.

Referring to FIGS. 4A-4C and 5A-5D, the shapes of the lateral sides of the cross section of the air cavity 112, and the angle formed by the lateral sides and at least one of the upper side and the lower side, are variously changed.

Since the trapezoidal shape of the air cavity 112 is symmetrical to each other in relation to the midpoint of the upper side and the lower side, FIGS. 4A-4C and 5A-5D illustrate only a one lateral side of the first and second lateral side.

The following description of the shape of the air cavity 112 may be applied to the bulk acoustic wave resonator as illustrated in FIG. 2 as well as the bulk acoustic wave resonator as illustrated in FIG. 1. In the case of the bulk acoustic wave resonator of FIG. 1, in the cross section of the air cavity 112, the long side L may correspond to the lower side, and the short side S may correspond to the upper side. In the case of the bulk acoustic wave resonator of FIG. 2, the long side L may correspond to the upper side, and the short side S may correspond to the lower side.

Hereinafter, a description will be provided based on the bulk acoustic wave resonator of FIG. 1, wherein the long side L of the air cavity 112 corresponds to the lower side and the short side S thereof corresponds to the upper side, for convenience of explanation.

The cross section of the air cavity 112 includes two legs, or lateral sides, connecting the long side L and the short side S, and each of the two legs includes at least one line segment. In addition, the cross section of the air cavity 112 includes a first contact point at which the short side S and the leg are in contact with each other, and a second contact point at which the long side L and the leg are in contact with each other.

Figure 4A:
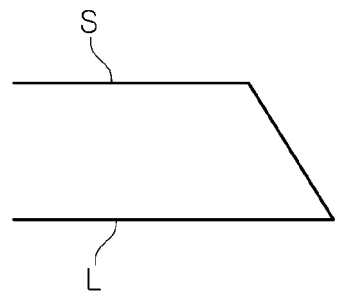
FIGS. 4A-4C and 5A-5D are views illustrating an example of a shape of an air cavity.
Figure 4B:
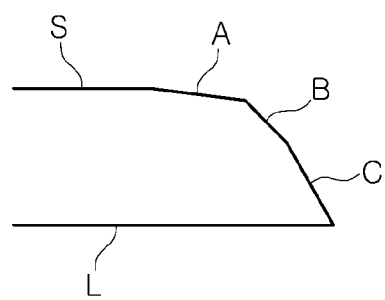
Figure 4C:
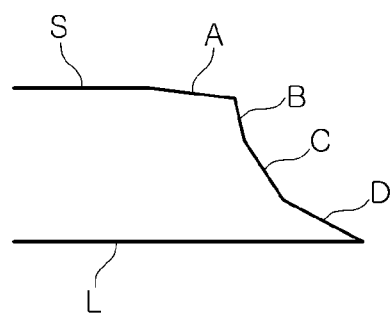

FIGS. 4A through 4C are views illustrating an angle of the first contact point and a shape of the leg in a relationship between the short side S and the leg. Referring to FIGS. 4A through 4C, the leg of the air cavity 112 are formed of at least one line segment.

Referring to FIG. 4A, the leg of the air cavity 112 is formed by one line segment, and the angle between the short side S and the leg at the first contact point may be greater than 90° and less than 180°.

Referring to FIG. 4B, the leg of the air cavity 112 has at least two line segments, in which the leg of the trapezoidal shape is approximately convex. Here, the leg of the air cavity 112 is formed of three line segments A, B, and C which are sequentially connected to the short side S. An angle formed between the line segment A and the line segment B may be greater than 90° and less than 180°.

Referring to FIG. 4C, the leg of the air cavity 112 has at least two line segments, in which the leg of the trapezoidal shape is approximately concave. Here, the leg of the air cavity 112 is formed of four line segments A, B, C, and D which are sequentially connected to the short side S. An angle formed between the line segment A and the line segment B may be greater than 90° and less than 180°, and an angle formed between an extension line of the line segment A and an extension line of the line segment C may be greater than 90° and less than 180°.

FIGS. 5A through 5D are views illustrating an angle of the second contact point and a shape of the leg in a relationship between the long side L and the leg. The leg of the air cavity 112 is formed of at least one line segment.

Figure 5A:
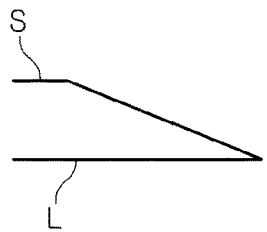

Referring to FIG. 5A, the leg of the air cavity 112 has one line segment, and the angle between the leg and the long side L at the second contact point may be greater than 0° and less than or equal to 70°.

Figure 5B:
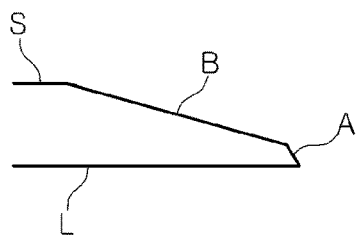
Figure 5C:
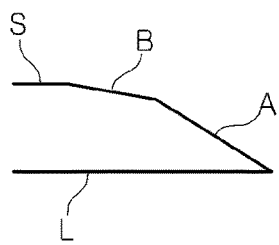

Referring to FIGS. 5B and 5C, the leg of the air cavity 112 has at least two line segments, in which the leg of the trapezoidal shape is approximately convex. Here, two line segments A and B are sequentially connected to the long side L. An angle formed between the long side L and the line segment A may be greater than 0° and less than or equal to 70°, and an angle formed between an extension line of the long side L and an extension line of the line segment B may be greater than 0° and less than or equal to 70°.

Figure 5D:
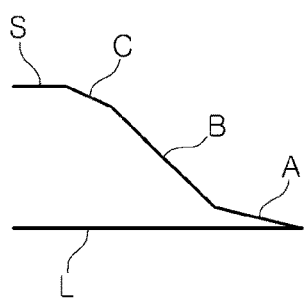

Referring to FIG. 5D, the leg of the air cavity 112 has at least two line segments, in which the leg of the trapezoidal shape is approximately concave. Here, the leg of the air cavity 112 is formed from three line segments A, B, and C, which are sequentially connected to the long side L. An angle formed between the long side L and the line segment A may be greater than 0° and less than or equal to 70°. An angle formed between an extension line of the long side L and an extension line of the line segment B may be greater than 0° and less than or equal to 70°.

Figure 6:
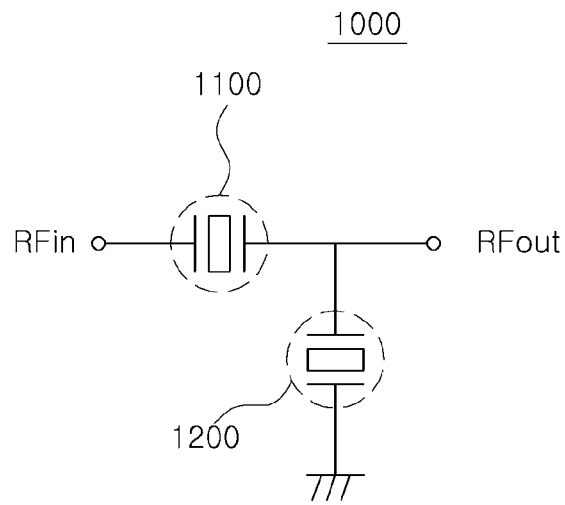
FIGS. 6 and 7 are schematic circuit diagrams of an example of a filter.

Referring to FIG. 6, a filter 1000 is a ladder type filter. Specifically, the filter 1000 includes a plurality of bulk acoustic wave resonators 1100 and 1200. Each of a plurality of bulk acoustic wave resonators correspond to the bulk acoustic wave resonator illustrated in FIG. 1.

A first bulk acoustic wave resonator 1100 is connected in series between a signal input terminal to which an input signal RFin is input and a signal output terminal from which an output signal RFout is output, and a second bulk acoustic wave resonator 1200 is connected between the signal output terminal and a ground.

Figure 7:
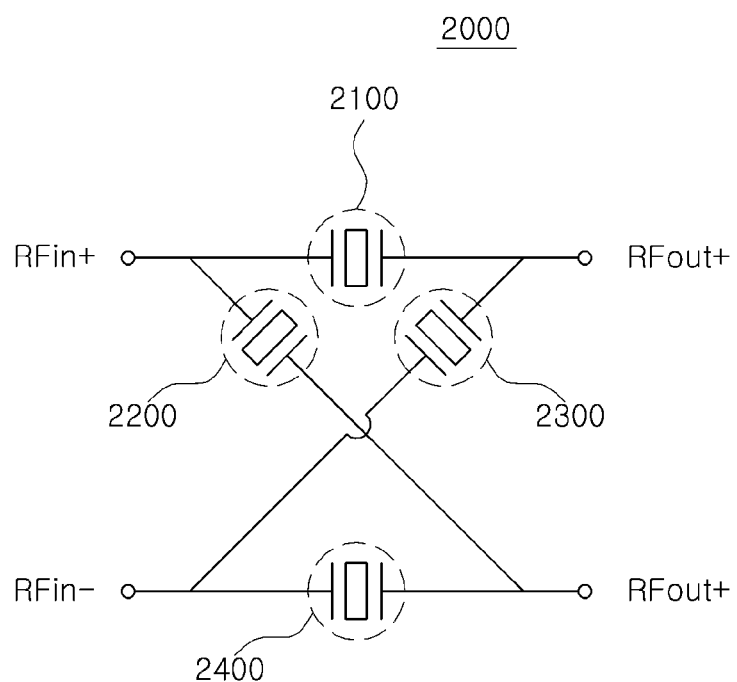

Referring to FIG. 7, a filter 2000 is a lattice type filter. Specifically, the filter 2000 includes a plurality of bulk acoustic wave resonators 2100, 2200, 2300, and 2400 to filter balanced input signals RFin+ and RFin− and output balanced output signals RFout+ and RFout−.

By adjusting the inclined shape and the angle of the legs of the air cavity 112, cracking formed in the layers or the membrane laminated at a side portion of the air cavity 112 is reduced, and preventing crystal growth in a non-ideal direction. Thereby, insertion loss characteristics and attenuation characteristics of the bulk acoustic wave resonator are improved.

As set forth above, the bulk acoustic wave resonator and the filter including the same prevents cracks from forming in the film or the layer laminated on the substrate, and induces normal crystal growth.

As a non-exhaustive example only, a terminal/device/unit as described herein may be a mobile device, such as a cellular phone, a smart phone, a wearable smart device (such as a ring, a watch, a pair of glasses, a bracelet, an ankle bracelet, a belt, a necklace, an earring, a headband, a helmet, or a device embedded in clothing), a portable personal computer (PC) (such as a laptop, a notebook, a subnotebook, a netbook, or an ultra-mobile PC (UMPC), a tablet PC (tablet), a phablet, a personal digital assistant (PDA), a digital camera, a portable game console, an MP3 player, a portable/personal multimedia player (PMP), a handheld e-book, a global positioning system (GPS) navigation device, or a sensor, or a stationary device, such as a desktop PC, a high-definition television (HDTV), a DVD player, a Blu-ray player, a set-top box, or a home appliance, or any other mobile or stationary device capable of wireless or network communication. In one example, a wearable device is a device that is designed to be mountable directly on the body of the user, such as a pair of glasses or a bracelet. In another example, a wearable device is any device that is mounted on the body of the user using an attaching device, such as a smart phone or a tablet attached to the arm of a user using an armband, or hung around the neck of the user using a lanyard.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk acoustic wave resonator (BAWR) comprising:
    a substrate;
    an air cavity formed on the substrate; and
    a resonating part formed above the air cavity and comprising a first electrode, a piezoelectric layer, and a second electrode which are sequentially laminated,
    wherein a cross section of the air cavity has a short side, a long side opposing and above or below the short side, and a first lateral side and a second lateral side respectively connecting the short side and the long side to each other,
    wherein the first and second lateral sides are respectively inclined for the connecting, and a surface roughness of any one or any combination of any two or more of the first electrode, the piezoelectric layer, and the second electrode are between 1 nm and 100 nm in a non-active region of the BAWR,
    wherein either one or both the first lateral side and the second lateral side each comprise inclined plural line segments connected between the short side and the long side, and
    wherein either one or both the first lateral side and the second lateral side comprise a first line segment, a second line segment, and a third line segment sequentially connected to the short side.

2. The bulk acoustic wave resonator of claim 1, wherein an angle formed between the first lateral side and the short side is greater than 90° and less than 180°.

3. The bulk acoustic wave resonator of claim 1, wherein an angle formed between the first lateral side and the long side is greater than 0° and less than or equal to 70°.

4. The bulk acoustic wave resonator of claim 1, wherein the first and second lateral sides each comprise at least two line segments.

5. The bulk acoustic wave resonator of claim 4, wherein either one or both the first lateral side and the second lateral side comprise a convex shape.

6. The bulk acoustic wave resonator of claim 5, wherein an angle formed between the first line segment and the second line segment is greater than 90° and less than 180°.

7. The bulk acoustic wave resonator of claim 5, wherein either one or both the first lateral side and the second lateral side comprise a first line segment and a second line segment sequentially connected to the long side, and
    an angle formed between the long side and the first line segment is greater than 0° and less than or equal to 70°.

8. The bulk acoustic wave resonator of claim 5, wherein either one or both the first lateral side and the second lateral side comprise a first line segment and a second line segment which are sequentially connected to the long side, and
    an angle formed by an extension line of the long side and an extension line of the second line segment is greater than 0° and less than or equal to 70°.

9. The bulk acoustic wave resonator of claim 7, wherein the angle is between 10° and 50°.

10. The bulk acoustic wave resonator of claim 4, wherein either one or both the first lateral side and the second lateral side comprise a concave shape.

11. The bulk acoustic wave resonator of claim 10, wherein the first lateral side and/or the second lateral side further comprises a fourth line segment sequentially connected to the short side, and
    an angle formed between an extension line of the first line segment and an extension line of the third line segment is greater than 90° and less than 180°.

12. The bulk acoustic wave resonator of claim 10, wherein either one or both the first lateral side and the second lateral side comprise a first line segment, a second line segment, a third line segment, and a fourth line segment sequentially connected to the long side, and
    an angle formed between the long side and the first line segment is greater than 0° and less than 70°.

13. The bulk acoustic wave resonator of claim 10, wherein either one or both the first lateral side and the second lateral side comprise a first line segment, a second line segment, a third line segment, and a fourth line segment which are sequentially connected to the long side, and
    an angle formed by an extension line of the long side and an extension line of the second line segment is greater than 0° and less than or equal to 70°.

14. The bulk acoustic wave resonator of claim 10, wherein an angle formed between the first line segment and the second line segment is greater than 90° and less than 180°.

15. The bulk acoustic wave resonator of claim 1, wherein the long side and the short side correspond to an upper side and a lower side of the air cavity.

16. A filter comprising:
a plurality of bulk acoustic wave resonators (BAWRs), each comprising:
a substrate;
a membrane formed on the substrate to form an air cavity; and
a resonating part, formed above the membrane, comprising a first electrode, a piezoelectric layer, and a second electrode which are sequentially laminated; and
a cross section of the air cavity having a short side, a long side opposing the short side, and a first lateral side and a second lateral side respectively connecting the short side and the long side to each other,
wherein the first and second lateral sides are respectively inclined for the connecting, and a surface roughness of any one or any combination of any two or more of the first electrode, the piezoelectric layer, and the second electrode are between 1 nm and 100 nm in a non-active region of the BAWRs,
wherein either one or both the first lateral side and the second lateral side each comprise inclined plural line segments connected between the short side and the long side, and
wherein the first lateral side has a convex portion and a concave portion.

17. The filter of claim 16, wherein the second lateral side has a convex portion and a concave portion.

18. A bulk acoustic wave resonator, comprising:
a substrate;
an air cavity formed on the substrate, the air cavity comprising a short side, a long side opposing the short side, and a first lateral side and a second lateral side connecting the short side and the long side to each other;
a resonating part formed on the air cavity and comprising a lower electrode, a piezoelectric layer, and an upper electrode which are sequentially laminated,
wherein the first and second lateral sides are inclined, and a surface roughness of either one or both of the upper electrode and the piezoelectric layer are between 1 nm and 100 nm, and
wherein either one or both the first lateral side and the second lateral side comprise a first line segment, a second line segment, a third line segment, and a fourth line segment sequentially connected to the long side, and an angle formed between the long side and the first line segment is greater than 0° and less than 70°.

* * * * *